US009229754B2

(12) United States Patent
Soundararajan et al.

(10) Patent No.: US 9,229,754 B2
(45) Date of Patent: Jan. 5, 2016

(54) DYNAMIC SCALING OF MANAGEMENT INFRASTRUCTURE IN VIRTUAL ENVIRONMENTS

(71) Applicant: VMware, Inc., Palo Alto, CA (US)

(72) Inventors: Vijayaraghavan Soundararajan, Palo Alto, CA (US); Shicong Meng, Atlanta, GA (US)

(73) Assignee: VMware, Inc., Palo Alto, CA (US)

( * ) Notice: Subject to any disclaimer, the term of this patent is extended or adjusted under 35 U.S.C. 154(b) by 0 days.

(21) Appl. No.: 14/154,769

(22) Filed: Jan. 14, 2014

(65) Prior Publication Data

US 2014/0130048 A1    May 8, 2014

Related U.S. Application Data

(63) Continuation of application No. 12/651,598, filed on Jan. 4, 2010, now Pat. No. 8,631,403.

(51) Int. Cl.
| | |
|---|---|
| *G06F 9/455* | (2006.01) |
| *G06F 17/50* | (2006.01) |
| *H04L 12/803* | (2013.01) |
| *H04L 12/721* | (2013.01) |
| *G06F 9/50* | (2006.01) |

(52) U.S. Cl.
CPC .......... *G06F 9/45533* (2013.01); *G06F 9/5077* (2013.01); *G06F 9/5088* (2013.01); *G06F 9/5083* (2013.01); *G06F 17/5077* (2013.01); *G06F 2009/4557* (2013.01); *H04L 45/44* (2013.01); *H04L 47/125* (2013.01)

(58) Field of Classification Search
CPC ... H04L 45/44; H04L 47/125; G06F 9/45533; G06F 17/5077; G06F 2009/4557; G06F 9/5083
USPC .............................................................. 718/1
See application file for complete search history.

(56) References Cited

U.S. PATENT DOCUMENTS

| | | | |
|---|---|---|---|
| 7,080,378 | B1 | 7/2006 | Noland et al. |
| 7,698,430 | B2 * | 4/2010 | Jackson ........................ 718/104 |
| 2005/0193113 | A1 | 9/2005 | Kokusho et al. |
| 2008/0184229 | A1 | 7/2008 | Rosu et al. |
| 2009/0210527 | A1 | 8/2009 | Kawato |
| 2010/0107159 | A1 | 4/2010 | Radhakrishnan et al. |

* cited by examiner

*Primary Examiner* — Jaweed A Abbaszadeh
*Assistant Examiner* — Xuxing Chen

(57) ABSTRACT

Methods, systems, and computer programs for performing management tasks in a virtual infrastructure are presented. The method includes detecting a decrease, below a predetermined threshold, in a number of tasks waiting to be processed by a plurality of virtual centers (VCs) executing as virtual machines (VMs) in a virtual infrastructure, wherein each of the plurality of VCs is a management VM for the managed objects of the virtual infrastructure. The method further includes, based on the detected decrease in the number of tasks waiting to be processed, selecting one or more VCs of the plurality of VCs to be removed, distributing managed objects handled by the selected one or more VCs to one or more non-selected VCs of the plurality of VCs, and removing the selected one or more VCs.

20 Claims, 12 Drawing Sheets

DYNAMIC SCALING OF MANAGEMENT INFRASTRUCTURE IN VIRTUAL ENVIRONMENTS

CROSS REFERENCE TO RELATED APPLICATIONS

This application is a continuation of U.S. application Ser. No. 12/651,598 filed on Jan. 4, 2010, which is hereby incorporated by reference in its entirety.

DESCRIPTION OF THE RELATED ART

Virtualization of computer resources generally involves abstracting computer hardware, which essentially isolates operating systems and applications from underlying hardware. Hardware is therefore shared among multiple operating systems and applications where each operating system, with its corresponding applications, is isolated in a corresponding virtual machine (VM) and where each VM is a complete execution environment. As a result, hardware can be more efficiently utilized.

The management infrastructure in a virtualized datacenter is responsible for monitoring the physical hosts and VMs running on the hosts, as well as for performing management operations, including provisioning and configuration tasks. Provisioning tasks include cloning virtual machines, creating new virtual machines, or moving virtual machines between physical hosts to balance the load on the hosts. Configuration tasks include adding more devices to a VM, increasing VM's memory, adding more virtual Central Processing Units (CPU), and adding new hosts to the infrastructure.

Current designs typically have a centralized, statically-sized management layer composed of a single server or group of servers. When management tasks are to be performed, the tasks are sent to these servers and the servers are responsible for communicating with the physical hosts that are running the VMs, performing the tasks, and tracking the results. If a large number of tasks are to be performed at once, the statically-sized management layer can become a bottleneck. Conversely, if the management infrastructure is idle, then too many management servers represent wasted resources.

Existing virtual systems use centralized system management that is statically configured together with a limited amount of distributed management. In some systems with distributed management, the hosts must be statically allocated among the management nodes. In addition, in some implementations, each management node has a separate database that is not shared with any other management nodes.

In general, statically configured management does not perform well when the number of VMs managed by a single Virtual Center (VC) grows too large, or when there is a burst in the number of tasks to be performed. Additionally, VCs using their own databases can not share management tasks with other VCs because they do not have access to the private databases of other VCs.

SUMMARY

The term virtual center (VC) as used herein means a management software that provides a mechanism to configure and manage one or more hosts, virtual machines (VMs), and other components of virtualized infrastructure.

Embodiments of the present invention provide methods, systems and computer programs for performing management tasks in a virtual infrastructure. Virtual Centers (VC) in the virtual infrastructure are added and deleted dynamically according to the congestion level in the VCs. The term virtual center as used herein means a management software that provides a mechanism to configure and manage one or more hosts, virtual machines, and other components of virtualized infrastructure.

It should be appreciated that the present invention can be implemented in numerous ways, such as a process, an apparatus, a system, a device or a method on a computer readable medium. Several inventive embodiments of the present invention are described below.

The systems and methods provided herein include detecting a decrease, below a predetermined threshold, in a number of tasks waiting to be processed by a plurality of VCs executing as VMs in a virtual infrastructure, wherein each of the plurality of VCs is a management VM for the managed objects of the virtual infrastructure. The systems and methods further include, based on the detected decrease in the number of tasks waiting to be processed, selecting one or more VCs of the plurality of VCs to be removed, distributing managed objects handled by the selected one or more VCs to one or more non-selected VCs of the plurality of VCs, and removing the selected one or more VCs.

DETAILED DESCRIPTION

Embodiments of the invention place VCs within VMs that can be dynamically created or destroyed depending on demand. In this manner, existing resources are efficiently utilized to perform management duties. During periods of high management activity, additional management virtual machines are spawned in order to handle these tasks. During periods of low management activity, these virtual machines are destroyed or suspended and the resources are freed for end-user applications. In one embodiment, the size of the management infrastructure is auto-scaled on demand.

Figure 1:
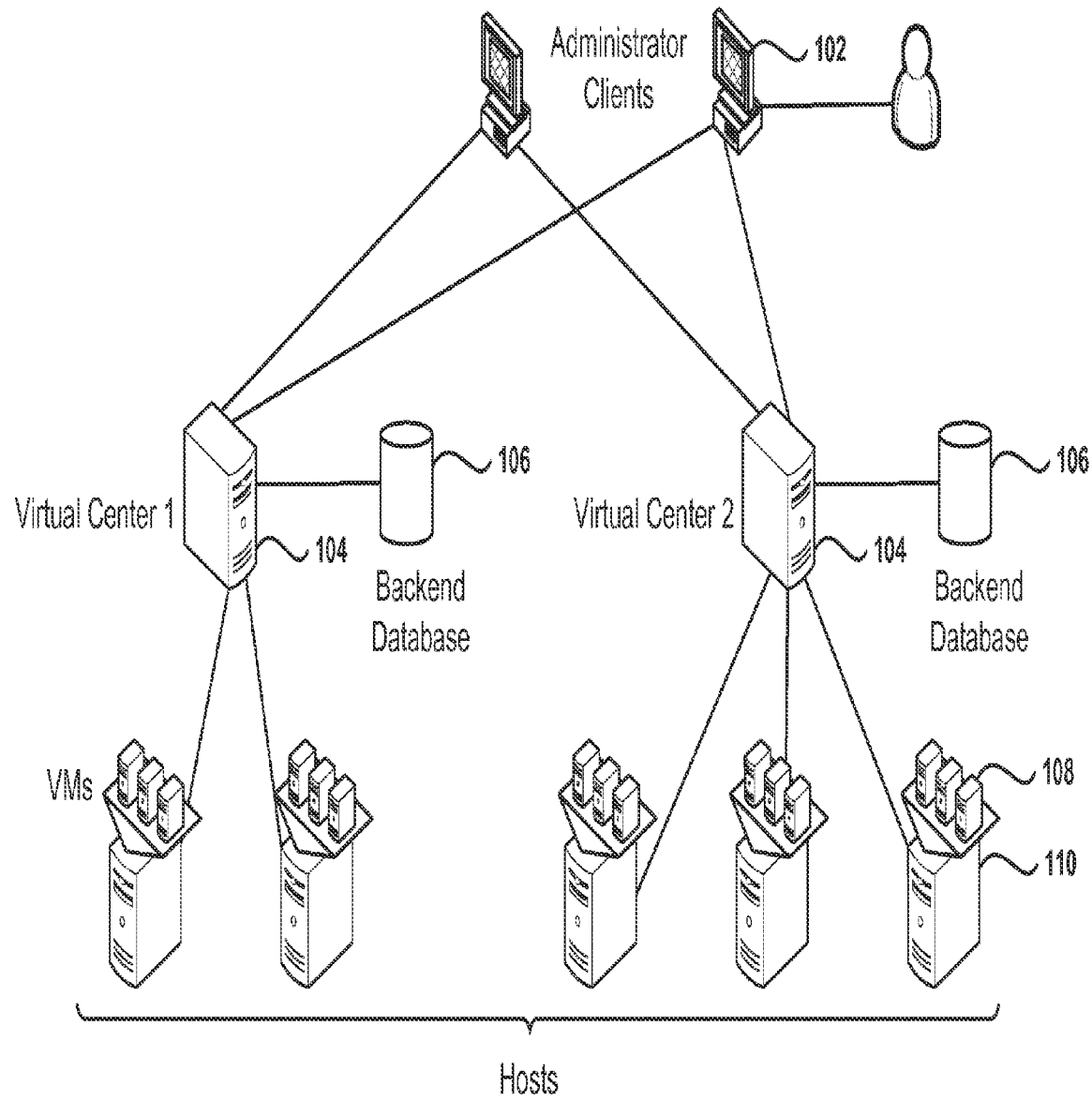
FIG. 1 depicts one embodiment of the system architecture for performing management tasks in a virtual infrastructure.

FIG. 1 depicts one embodiment of the system architecture for performing management tasks in a virtual infrastructure. A virtualized datacenter consists of physical hosts 110 that run virtual machines 108 as well as the appropriate networking, storage, and power. The physical hosts and the VMs the hosts run are known as managed objects, because the management layer performs operations ("methods") on them. In typical installations, a separate physical server is used to run the software that manages these hosts and VMs. This physical server is commonly referred to as Virtual Center 104, or management server. VC 104 software can also be run inside a VM.

To prevent VC 104 from becoming a bottleneck when managing a large number of physical hosts or virtual servers, many designs use multiple VCs, statically partitioning the physical hosts between the multiple VCs. A static partitioning can be inefficient and a waste of resources. First, static partitioning requires that the user determines in advance how many VCs are needed, which can be challenging in a dynamically growing environment or an environment with great changes in load. Second, when the VC is idle, the VC's resources are wasted.

The scenario shown in FIG. 1 includes two VCs 104, where each VC manages different sets of hosts and VMs. Additionally, each VC utilizes its own backend database 106. Administrator's clients 102 allow the user to configure the VCs in the virtual infrastructure. In general, there may be multiple such virtualized infrastructures, each consisting of a group of physical datacenters and physical hosts. If there are multiple infrastructures, then a separate management server and database is used to manage each infrastructure. These servers share very little data, and databases 106 are completely isolated from one another. In addition, the allocation of physical hosts to management servers is done statically, and does not typically change without a great deal of manual effort.

If multiple VCs do not share data with one another, and if a given VC becomes overloaded with operations on certain hosts, these operations cannot be moved to another VC, because the data for those hosts does not reside in the databases (DB) of the other VCs. To lighten the load on the first VC, the hosts connected to this first VC would have to be manually moved to a different VC. This move may require deleting information from the database server connected to the first VC, and then inserting that information into the database server connected to a second VC.

Embodiments of the invention dynamically grow and shrink the size of the management layer on demand, rather than requiring a static partition of hosts to management servers. The management of the virtualized infrastructure resides in VMs called "management VMs," which are instances of VCs. Management VMs implement management services. In contrast, "application VMs" are responsible for running end-user applications, such as web services. Management VMs are created and destroyed (or resumed and suspended) automatically in response to varying management workloads, and the application VMs are created and destroyed in response to varying application workloads. In one embodiment, VCs can be a mix of actual hardware servers and VMs running as VCs. In this case, the Management VMs created correspond to VCs running as VMs.

Figure 2:
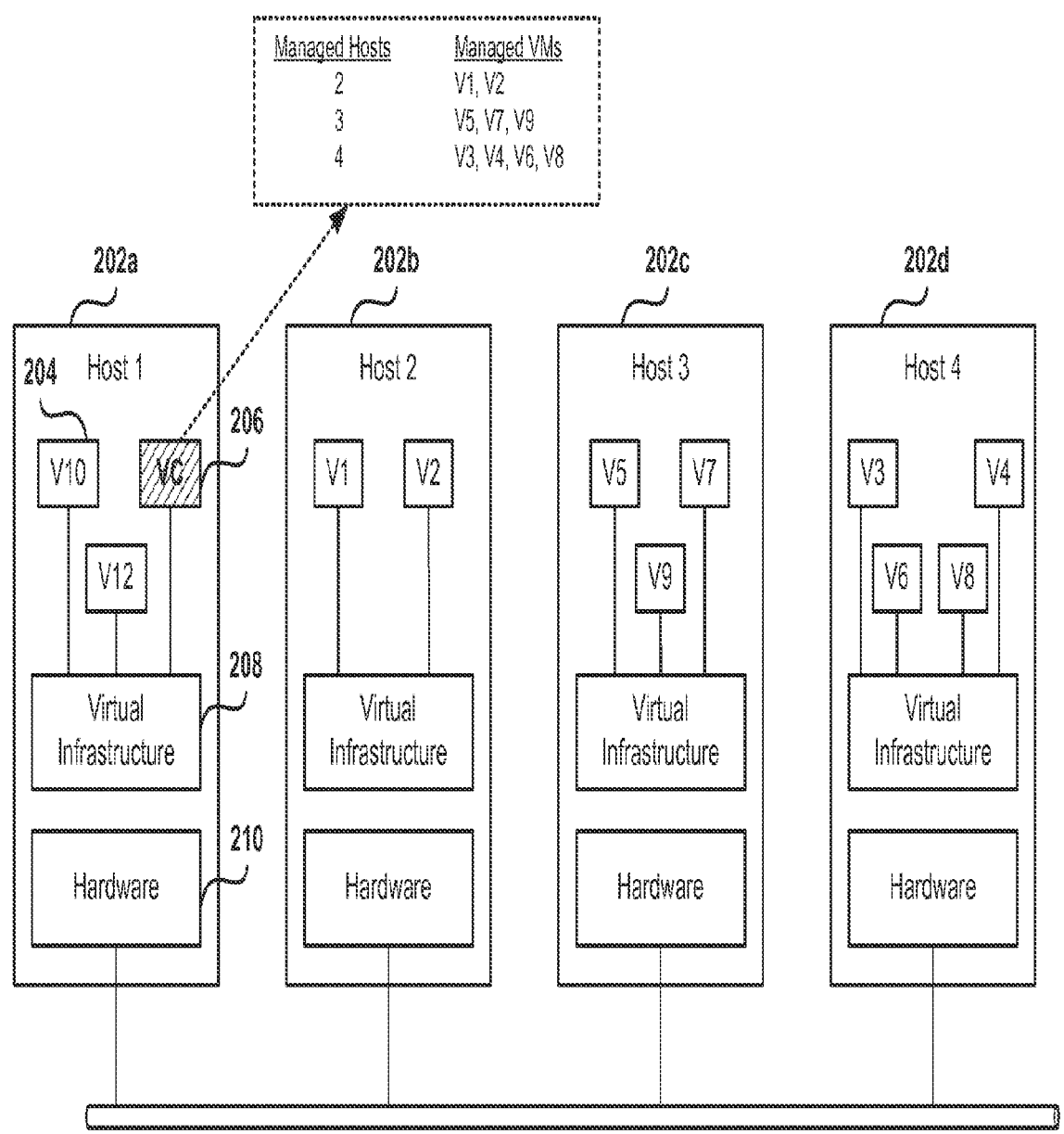
FIG. 2 illustrates a Virtual Center (VC) executing as a virtual machine (VM) in a multi-host configuration, according to one embodiment.

FIG. 2 illustrates a Virtual Center executing as a virtual machine in a multi-host configuration, according to one embodiment. The virtual system includes hosts 202a-202d where VMs 204 execute. The hosts include virtual infrastructure software that provides virtualization services for executing VMs 204, including virtualization of hardware components 210. VC 206 executing as a VM on host 202a is managing hosts 2-4 and the corresponding VMs.

Figure 3:
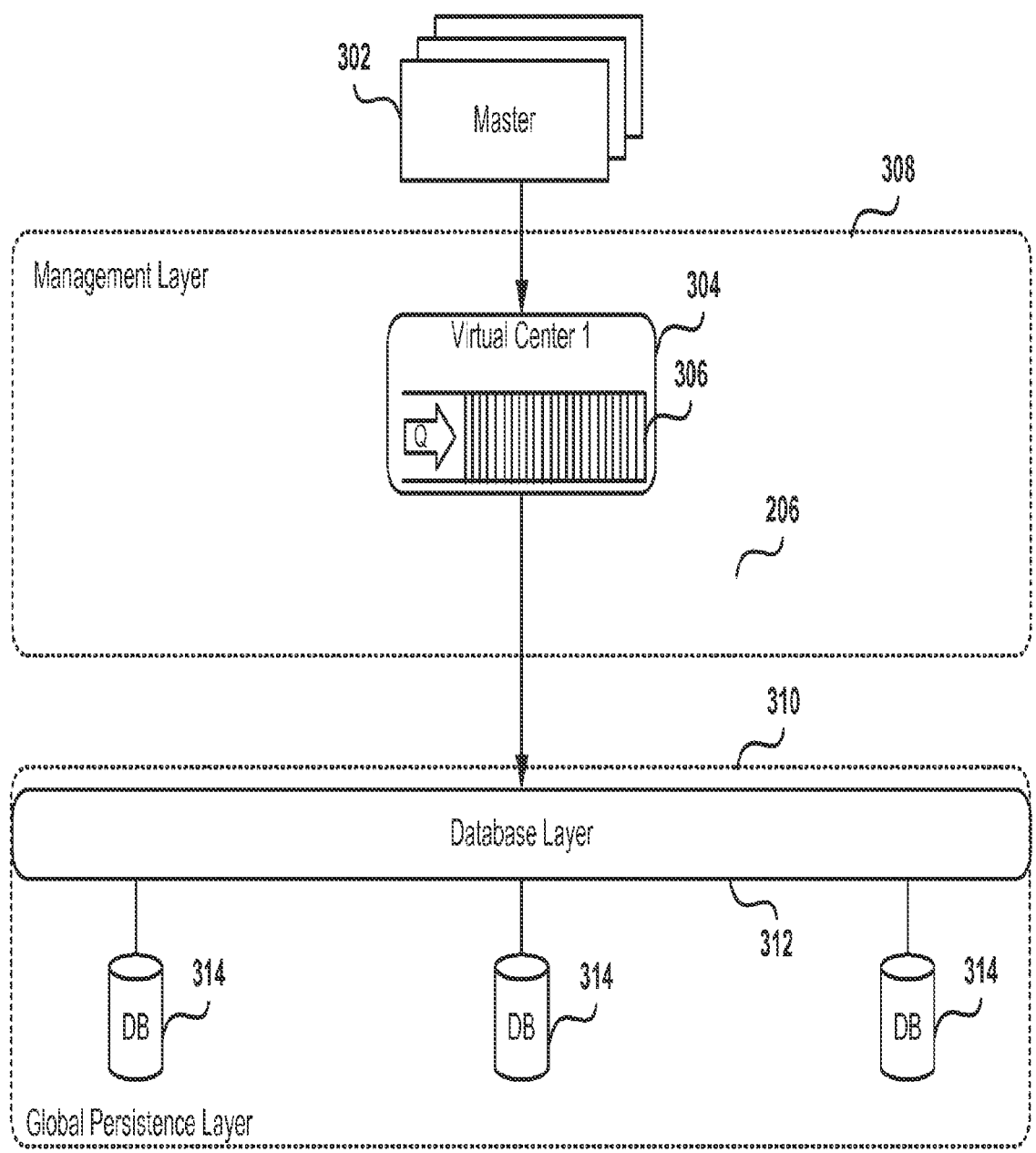
FIG. 3 illustrates an embodiment of the management infrastructure including one VC, in accordance with one embodiment of the invention.

FIG. 3 illustrates an embodiment of the management infrastructure including one VC 304, in accordance with one embodiment of the invention. The management components of the virtual infrastructure are one or more Master nodes 302, management layer 308, and global persistence layer 310. The global persistence layer 310 is also referred to herein as the global database. Master node 302 determines if more management VCs are needed to relieve management congestion, and if so, how many management VCs should be added. Further, Master node 302 coordinates the creation and destruction of VCs, distributes managed objects among these VCs, and distributes the work to the newly-spawned VMs. The single management server and single DB model of FIG. 1 is replaced with a collection of management servers and a globally-shared database. Management layer 308 includes the VCs created, and in the scenario of FIG. 3, only one VC 304 has been created at a moment in time. As a result, VC 304 is managing all hosts and VMs. Each VC includes queue 306 of tasks waiting to be processed, such as creating VMs, migrating VMs, cloning VMs, backups, etc.

In one embodiment, each VC resides in a VM, and all of the data for each host and VM is stored in the global database (DB). The global database includes a database layer for managing the requests from the management layer, and a plurality of databases 314 holding the management-related information. In one embodiment, databases 314 are also executed in VMs. When a flood of management requests take place at single VC, new VCs are automatically spawned, hosts are automatically redistributed among the existing VCs, and the configuration data is quickly loaded to the VCs from the global DB. Tasks are then redistributed to the newly-spawned management VCs.

In one embodiment, the process of spawning new VCs is accelerated by maintaining one or more VCs in a suspended state, and then resuming VCs from the suspended state upon demand. Master node 302 is responsible for monitoring the load on the various VCs, spawning new ones as required, and removing these management VCs as needed.

Figure 4:
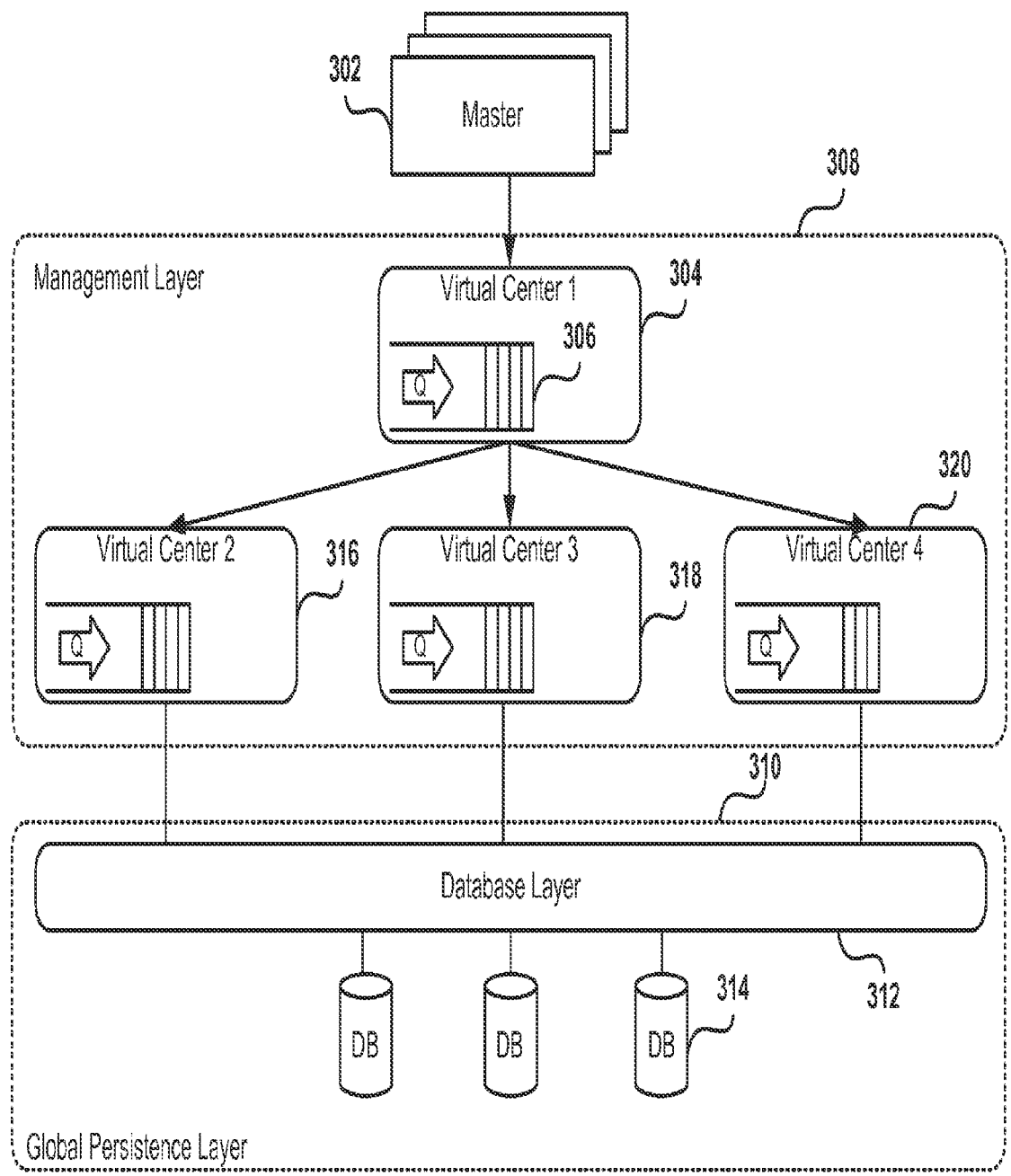
FIG. 4 illustrates the creation of additional VCs in the management infrastructure, according to one embodiment.

FIG. 4 illustrates the creation of additional VCs in the management infrastructure, according to one embodiment. FIG. 4 shows the scenario after new VCs have been created. In this scenario, a large number of tasks are waiting to be executed at one VC, such as the one shown in FIG. 3. The VC becomes busy and the response time increases. As a result, management layer 308 determines that more VCs are required to process the additional load. Master node 302 determines that additional VCs are needed and then spawns additional management VCs 316, 318, and 320 in management layer 308. The original VC and the additional VCs then process the pending tasks, such as spawning a large number of application VMs to service the additional request load. The VCs monitor the additional application VMs if new VMs are added, monitor additional hosts if new hosts are added, collect statistics on those nodes, and are responsible for performing other management operations, like reconfiguring the application VMs.

If the management layer did not create additional management VCs, the existing VC would also become overburdened with monitoring the newly-spawned application VMs. In the case where the queued tasks are for the creating additional VMs, the task of spawning the large number of application VMs is now spread across multiple VCs. When the task of creating all of the application VMs is done, these newly-created VCs can be destroyed or suspended. If a new burst of application VMs is required, then these VCs can be resumed or re-created in order to process the new tasks.

Spawning additional application VMs (e.g., 500 VMs) is only one possible application for adding management servers. There are a large number of potentially bursty management tasks, like updating or adding hosts, reconfiguring VMs, moving VMs from busy hosts to idle hosts, performing a 2:00 AM backup for 1,000 VMs, etc. By absorbing the extra load caused by the need to create large number of application VMs, this auto-scaling management infrastructure provides robust and scalable performance of management operations. In another embodiment, the creation of new VCs can also be performed proactively, before the queued tasks become very large, or by analyzing system behavior over time to forecast congestion. For example, an administrator may observe that every day around 9:00 AM, the beginning of the work day, 500-800 VMs need to be powered on for the arriving workers. The system can then start creating VMs at 8:30 and then be ready at 9:00 for the increased management demands.

Automatically spawning new management VCs has several advantages:
1. Ease of deployment. The administrator does not have to size the number of management servers, and as the virtualized environment grows, the administrator does not have to partition hosts, because it is done automatically.
2. Fast creation and destruction of VCs in response to load changes. Instead of provisioning new physical management servers, VMs are used for the VCs, easing the deployment of new servers. Moreover, if the VMs are in a suspended state, the VMs merely need to be resumed before they are ready to run. Destroying the VM is as simple as suspending the VM.
3. High availability. The global DB is built using highly-available nodes. In addition, there are multiple VC nodes and more can be spawned easily, so there is no single point of failure. Additionally, the existence of multiple Master nodes improves the availability of the system.
4. Better resource usage. The VCs can run on physical hosts that have unused cores or spare cycles.

Master node 302 determines the configuration of the management system, including the default number of VC nodes in the management layer and the number of VC nodes to dynamically set up for auto-scaling. In one embodiment, Master node 302 makes configuration decisions based on the inventory size of the managed datacenter and the management capacity of each VC node. Specifically, Master node 302 distributes managed objects among VC nodes at the granularity of physical hosts. However, other embodiments may distribute objects in other ways, such as by datacenter, main function of the VMs being managed, logical groups, division within a corporation, etc. To determine the number of VC nodes to use, each VC node is configured to manage a set of hosts with a lower and upper bound on the number of hosts (e.g., 50 to 100, although other ranges are also possible). The Master node then assumes the number of hosts managed by each VC node is at the lower bound, and starts up just enough VC nodes to cover all physical hosts in the inventory. There are two main reasons for assuming each VC node manages the minimum number of hosts. First, the Master node can ensure that management layer has a sufficient number of VC nodes to manage hosts. Second, the Master node can ensure that each VC node has enough residual capacity to manage additional hosts and to handle a temporary increase in workload. When the number of hosts in the inventory increases, the Master node can simply start up new VC nodes to manage those newly-added hosts in the same way. When new hosts are needed, the system can use an existing VC with residual capacity to manage the additional loads, or the system can spawn additional VCs to accommodate the new hosts.

Master node 302 also determines the proper number of VC nodes to maximize the benefits of auto-scaling. In particular, Master node 302 determines the number of new VC nodes that are needed based on the management workload, the processing speed of each auto-scaled VC node, and the cost for setting up new VC nodes. Since auto-scaling requires a managed host to be disconnected from its original owner VC node and to be reconnected to a new auto-scaled VC node, in one embodiment the latency of host disconnecting and connecting is taken into consideration to maximize the benefit of auto-scaling.

In another embodiment, the creation of additional VCs may include additional criteria beyond congestion. For example, an administrator may assign different VCs to different entities or functions and segment the VCs accordingly. For example, the administrator may create one VC segments for Research and Development (RND), Sales, Support, Accounting, etc. Segmentation can also be geographic, thus forcing the creation of VCs by U.S. state, or by region (West, Central, Mountain, East), etc.

The embodiment shown in FIG. 4 illustrates the creation of 3 additional VCs 316, 318, and 320 to offload management tasks from VC 304. The tasks queued at VC 304 have been redistributed, such that VC 304 keeps some tasks for processing, and the newly-created VCs get the other tasks transferred to their corresponding queues. More details on the reassignment of tasks are given below in reference to FIG. 8.

If the virtual infrastructure is organized in a cluster, the management infrastructure must keep a consistent view of the cluster. In one embodiment, a new cluster is created and the hosts are subdivided among the clusters. In another embodiment, new VCs coordinate access to the same cluster. The resources in the cluster are spread across the multiple VCs, and the VCs cooperate among themselves for shared access to this cluster. The existence of a global management database facilitates this cooperation between the VCs.

Figure 5:
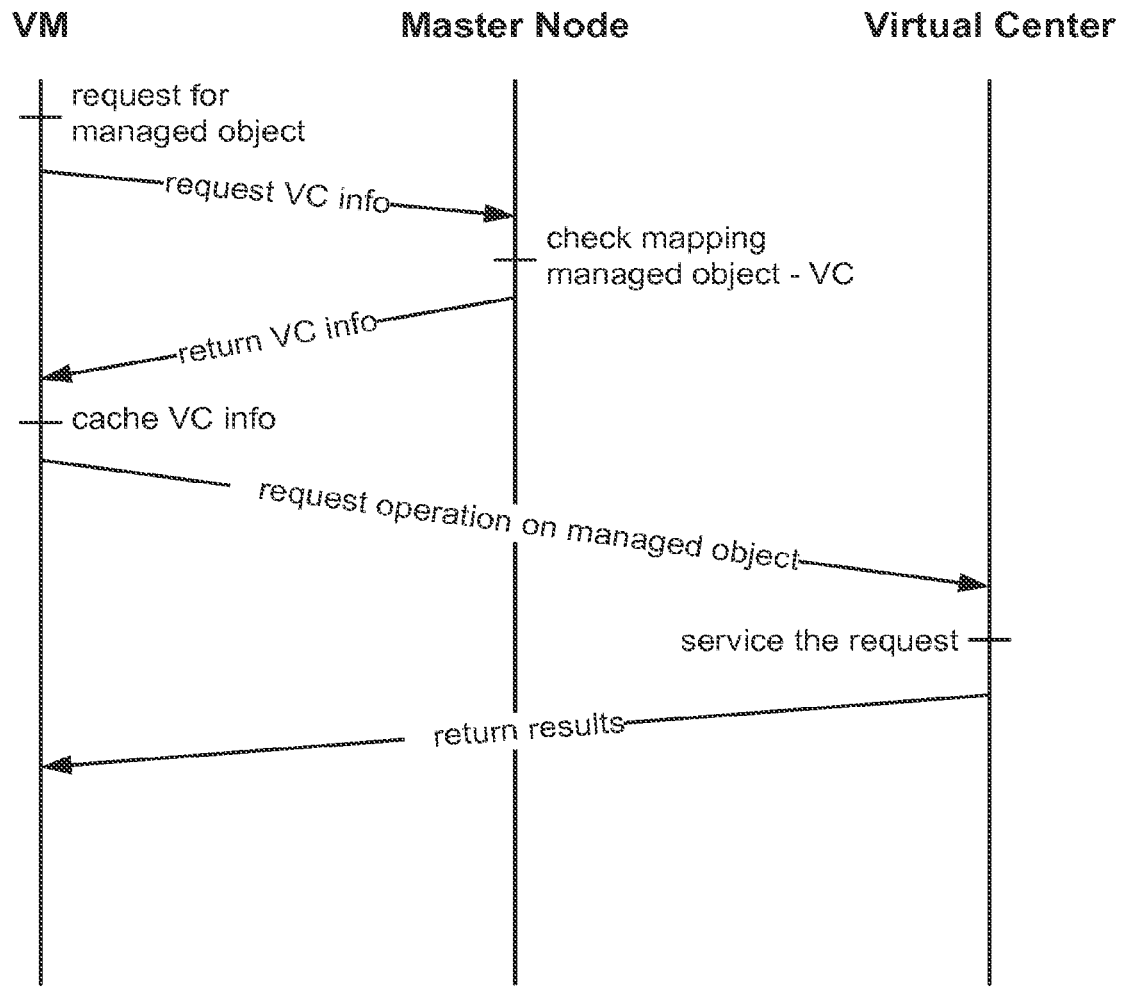
FIG. 5 illustrates the sequence for binding a client with a VC, according to one embodiment.

FIG. 5 illustrates the sequence for binding a client with a VC, according to one embodiment. The client has a request for an operation on a managed object. Since the client does not know which VC can service the request, the client sends a request for information to the Master node. The Master node checks its database to identify which VC is mapped to the requested object, or in other words, which VC can service this request. Once the VC is identified by the Master node, the Master node replies to the client with the VC information.

The client then caches this information in order to contact directly the VC for future requests for this managed object. In another embodiment, the client does not cache the VC information and consequently, the client always checks with the Master node whenever the client needs information regarding the VC that is mapped to a particular managed object. Further, the client sends the request operation on the managed object to the VC identified by the Master node. The VC services the request and then returns results, such as a completion status, to the client.

Figure 6:
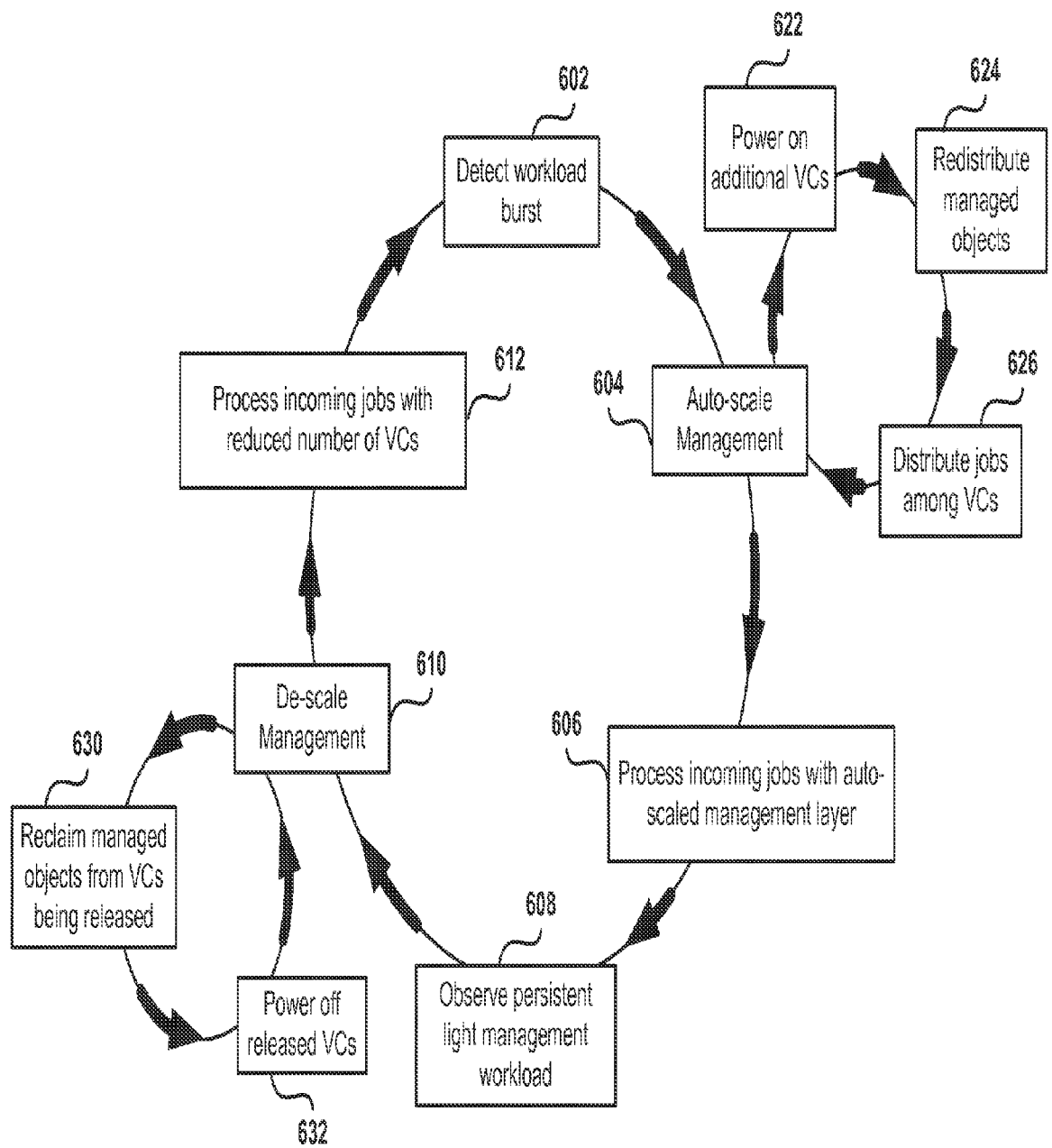
FIG. 6 depicts a method for auto-scaling the management infrastructure, according to one embodiment.

FIG. 6 depicts a method for auto-scaling the management infrastructure, according to one embodiment. The VC nodes can be dynamically created, powered-on, suspended and destroyed as necessary. The Master node coordinates the creation, powering-on, suspending and destruction of VCs and monitors the status of the VCs. When the Master node detects a workload burst 602, the system will enter auto-scale management phase 604 to increase the number of available VCs. In another embodiment, the auto-scale management phase is not detected by the Master node, but rather by an overloaded VC itself, another VM, or some other management entity.

The auto-scale management phase starts by powering on additional VCs 622. In one embodiment, the VC layer contains only a template VM which includes an operating system and a suite of pre-installed VC software. The template is configured to have a small disk footprint, a small number of CPUs, and a small memory footprint. During first-time installation, the Master node determines the default number of VC nodes for a given inventory. The VC layer then creates the default number of VCs by cloning the aforementioned template VM. These VCs form the initial management layer and manage entities in the given inventory. In one embodiment, the VCs are categorized into two types: those for the default VC layer, and those for auto-scaling. The former VCs are standard VMs that have been powered-on and are actively managing hosts. The latter VCs are powered-on, loaded with the inventory, and put into suspended mode. In another embodiment, a cloned VC loads the required management information from the global DB when the VC is powered on.

In another embodiment, only one additional VC is powered on in each cycle. Once the work is distributed among the different VCs, the system reassesses if more VCs are needed, and if so, adds one more VC until auto-scale is no longer required.

One of the critical requirements for auto-scaling is that each VC node should be able to dynamically startup in a timely manner. The startup of a VC node includes the following steps: powering on the corresponding VC, starting the management software on that node, and loading the inventory information from the data persistence layer. To speed up this process, i.e., to reduce the latency of VC node startup, each auto-scaling VC node is pre-loaded with the inventory before startup. The process then loads the inventory information from the data persistence layer. When host information is loaded on the newly created VCs, the data persistence layer indicates that all hosts on that VC are currently disconnected, so that the hosts can be more quickly connected later during auto-scaling. The reason for listing the hosts as disconnected is that only one VC can manage a given host. If a host were listed as connected, then the VC would try to attach to the host, and that would cause a conflict because multiple VCs would be trying to manage the same host. Additionally, it is quicker to attach a host from the disconnected state than to add a host from scratch, since adding a host from scratch requires downloading an agent onto the host. In another embodiment, the inventory is pre-loaded on each VC, and each host on that VC is noted as disconnected. When the VC is started up, the appropriate hosts are connected to their respective VCs (i.e., the VC that will manage those hosts).

The Master node distributes managed objects 624 to VCs so that each VC manages a subset of managed objects in the inventory. It follows an efficient heuristic algorithm to distribute managed objects. First, the Master node sorts the list of datacenter objects in the inventory based on the number of hosts in each datacenter object. Second, the Master node assigns datacenter objects from the VC with the largest number of hosts to other VC nodes. Specifically, the Master node assigns each datacenter object to the VC node that currently has the most residual capacity in terms of the number of hosts that the VC can manage. If the datacenter object is too large to fit in one VC node (i.e., the number of hosts in the datacenter object exceeds the number of hosts that can be managed by the VC node), the Master node goes down to a lower level and assigns cluster objects in the datacenter object to VC nodes. Similarly, the Master node assigns the current largest cluster object (the cluster with the most hosts or VMS) to the VC node that has the most residual capacity. If the Master node finds that a cluster object is too large to fit into one VC node, the Master node again uses a finer assignment granularity to assigns hosts in the cluster object to VC nodes. When all clusters and standalone hosts in the datacenter object have been assigned, the datacenter object is assigned to all VC nodes that manage its clusters or hosts.

Managed objects are classified into types based on synchronization requirements: exclusive managed objects and shared managed objects. The exclusive managed objects are objects managed by a single VC node, and the shared managed objects are managed by multiple VC nodes. For example, when a datacenter object is assigned to more than one VC (because the member clusters are managed by multiple VCs), the datacenter object is a shared managed object. When a command is issued to an exclusive managed object, the command is executed by the corresponding VC node locally. However, when a command is issued to a shared managed object, the command will be executed with concurrency control as it would cause inconsistent states of shared managed objects among different VC nodes otherwise. The VC layer enforces concurrency control with disk-based locks at the data persistence layer. Specifically, the VC node executing a modification command on a shared object first applies a disk-based lock. The VC node executes the command only after the lock is acquired. Otherwise, the VC node waits and retries until it obtains the lock or hits the maximum number of retries. It should be noted that the disk-based locks also consist of two types, object locks and state locks. An object lock synchronizes any access to the object, while a state lock helps prevent conflicting operations from occurring on an object. For example, while a VM is being powered-on, the VM cannot be removed from the inventory.

In operation 626, the jobs or tasks waiting to be processed are distributed among the VCs. As previously discussed in reference to FIG. 5, the Master node maintains a mapping between managed objects and VC nodes that manage the corresponding objects. The mapping is initially performed when adding hosts to spawned VCs, where the new VCs get the VMs associated with the corresponding added host. When a client issues an operation on a specific managed object, the client first queries the Master node for the Internet Protocol (IP) address of the VC node that manages the given managed object via a Remote Procedure Call (RPC). The Master node performs a lookup over its managed-object-to-VC mapping and returns the result to the client. The client then caches this mapping information and send the operation directly to the returned VC node. This way the incoming jobs are processed 606 with the auto-scaled management layer.

If the system observes persistent light management workload 608 then the system will reduce the number of VCs by entering de-scale management phase 610. In this phase, the Master node determines the number of VCs to be decommissioned based on the current amount of queued tasks and ongoing management requirements. For example, the management load may be relatively low, as compared to the load that required auto-scale management 604, but the number of hosts and VMs can be much higher. Due to this increase in management load, the system may not decommission the same number of VCs that were created in auto-scaling. For example, suppose there is initially one VC managing 1,000 VMs. The system then adds 2,000 more VMs, and to create the VMs and manage them the system adds four more VCs. After a few hours and once the new VMs are added, the system's management load becomes light and the Master node initiates de-scaling. The Master node assigns three VCs to manage the 3,000 VMs: therefore, two VCs are decommissioned.

Initially, the managed objects from the VCs being released or decommissioned are reclaimed 630. Afterwards, the released VCs are powered off 632. In another embodiment, the VCs are suspended and be made available in case there is congestion once again in the management layer. Once de-scale management phase 610 is complete, the system processes incoming jobs with the reduced number of VCs 612.

It should be appreciated that the embodiments illustrated in FIG. 6 are exemplary methods for dynamically adding or subtracting management resources. Other embodiments may utilize different operations, perform operations in a different order, or change the number of VCs that are added or purged at one time. The embodiments illustrated in FIG. 6 should therefore not be interpreted to be exclusive or limiting, but rather exemplary or illustrative.

Figure 7:
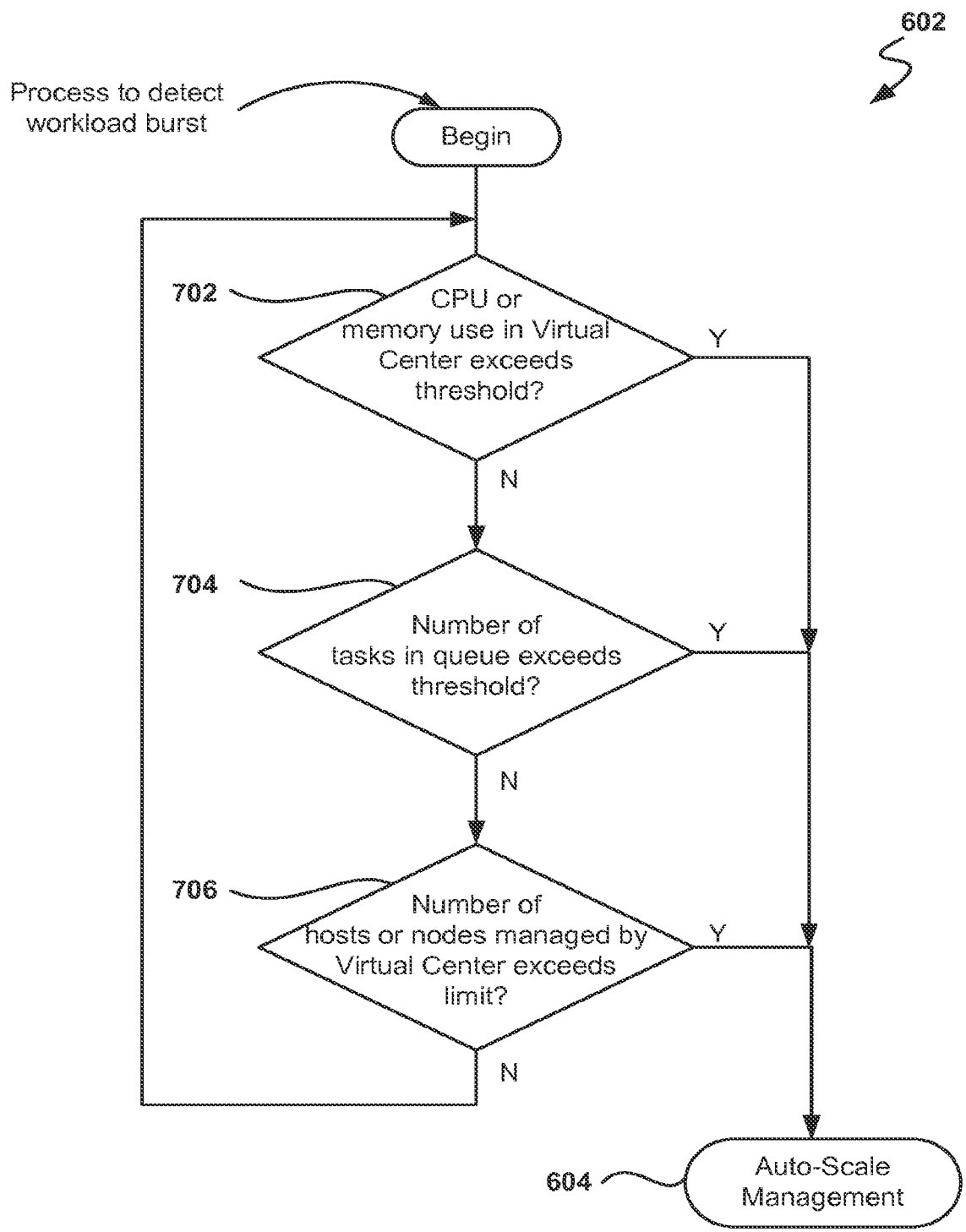
FIG. 7 shows an embodiment of a process for detecting a workload burst.

FIG. 7 shows an embodiment of a process for detecting a workload burst 602. The Master node, or other management related entity such as a VC, performs three types of checks to detect a workload burst. Initially, in operation 702 the Central Processing Unit (CPU) and the memory being used by one or more VCs are checked to see if either one of them exceeds a respective threshold. If either threshold is exceeded, then the method proceeds to operation 604 to initiate the auto-scaling of the management infrastructure; that is, the creation of additional VCs or the addition of other management resources. If the thresholds are not exceeded, the method proceeds to operation 704 where the number of tasks waiting to be processed is checked to see if the number of tasks exceeds a task threshold. If the task threshold is exceeded, the method flows to operation 604 and to operation 706 otherwise.

In operation 706, the number of hosts and VMs being managed by each VC is checked. If the number of hosts or the number of nodes exceeds a limit, then auto-scaled is initiated. Otherwise, the method flows back beginning operation 702 to iterate the process. It should be appreciated that the embodiment illustrated in FIG. 7 contains exemplary tests for detecting congestion in the management area. Other embodiments may utilize different tests, or may check additional parameters. The embodiment illustrated in FIG. 7 should therefore not be interpreted to be exclusive or limiting, but rather exemplary or illustrative.

Figure 8:
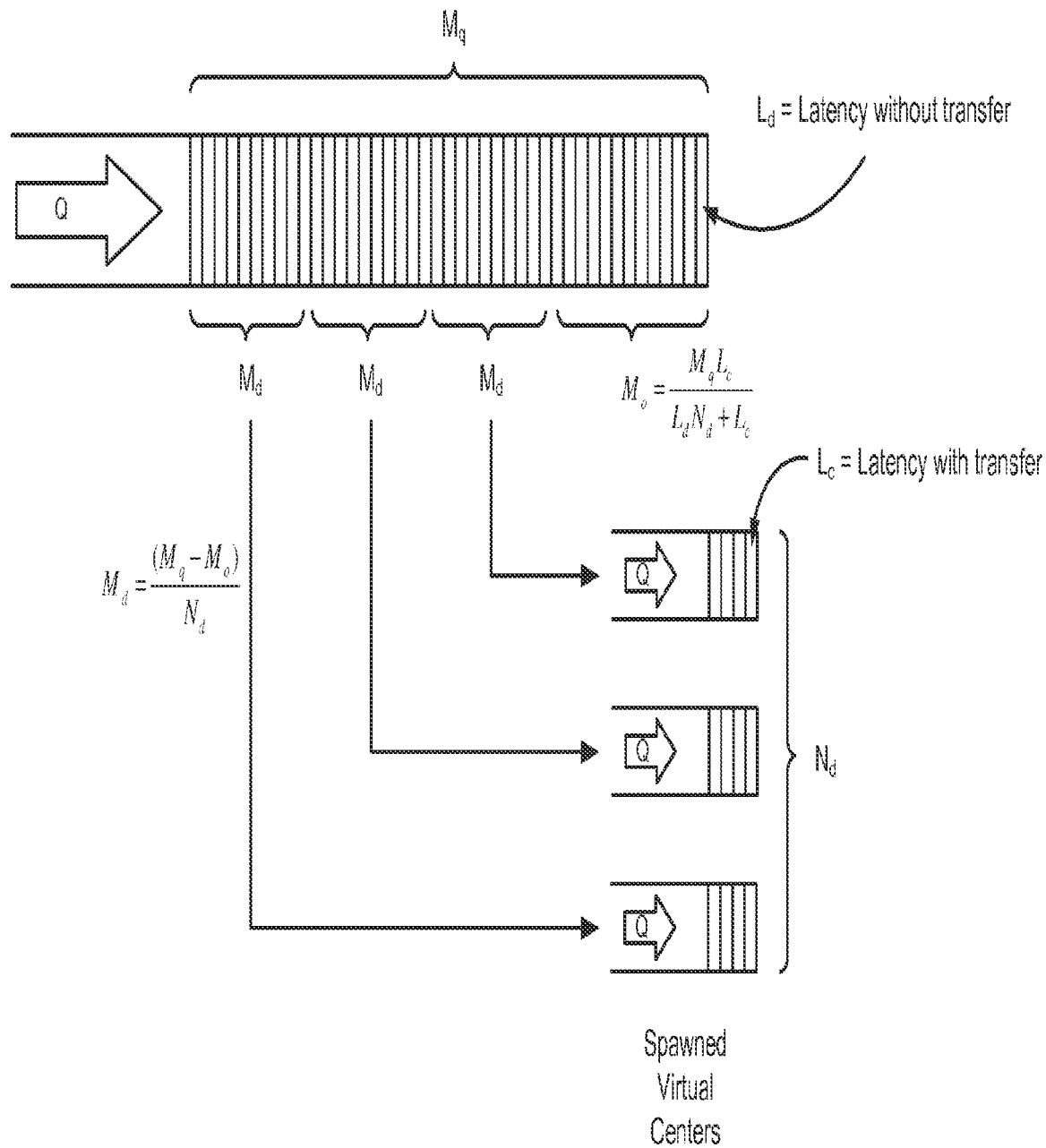
FIG. 8 illustrates an embodiment for reassigning management tasks after spawning additional VCs, in accordance with one embodiment of the invention.

FIG. 8 illustrates an embodiment for reassigning management tasks after spawning additional VCs, in accordance with one embodiment of the invention. When the Master node detects a management workload burst at a VC, denoted as $V_o$, the Master node checks the amount of management resources that are available to the management service to determine the number of VC nodes $N_d$ that should be started up. Assuming the number of jobs in the queue of $V_o$ is $M_q$ after the $N_d$ new VC nodes have been started, the Master node then estimates the latency of directly executing one job without host connecting, $L_d$, and the latency of executing one job with host connecting, $L_e$. The Master node then assigns $M_o$ jobs to the original VC node $V_o$ and $M_d$ jobs to each of the newly started VC nodes, where $M_o$ and $M_d$ are calculated with the following formulas:

$$M_d = \frac{(M_q - M_o)}{N_d} \quad (1)$$

$$M_o = \frac{M_q L_c}{L_d N_d + L_c} \quad (2)$$

This way, $V_0$ and the newly started VC nodes take about the same time to finish their assigned jobs.

Figure 9:
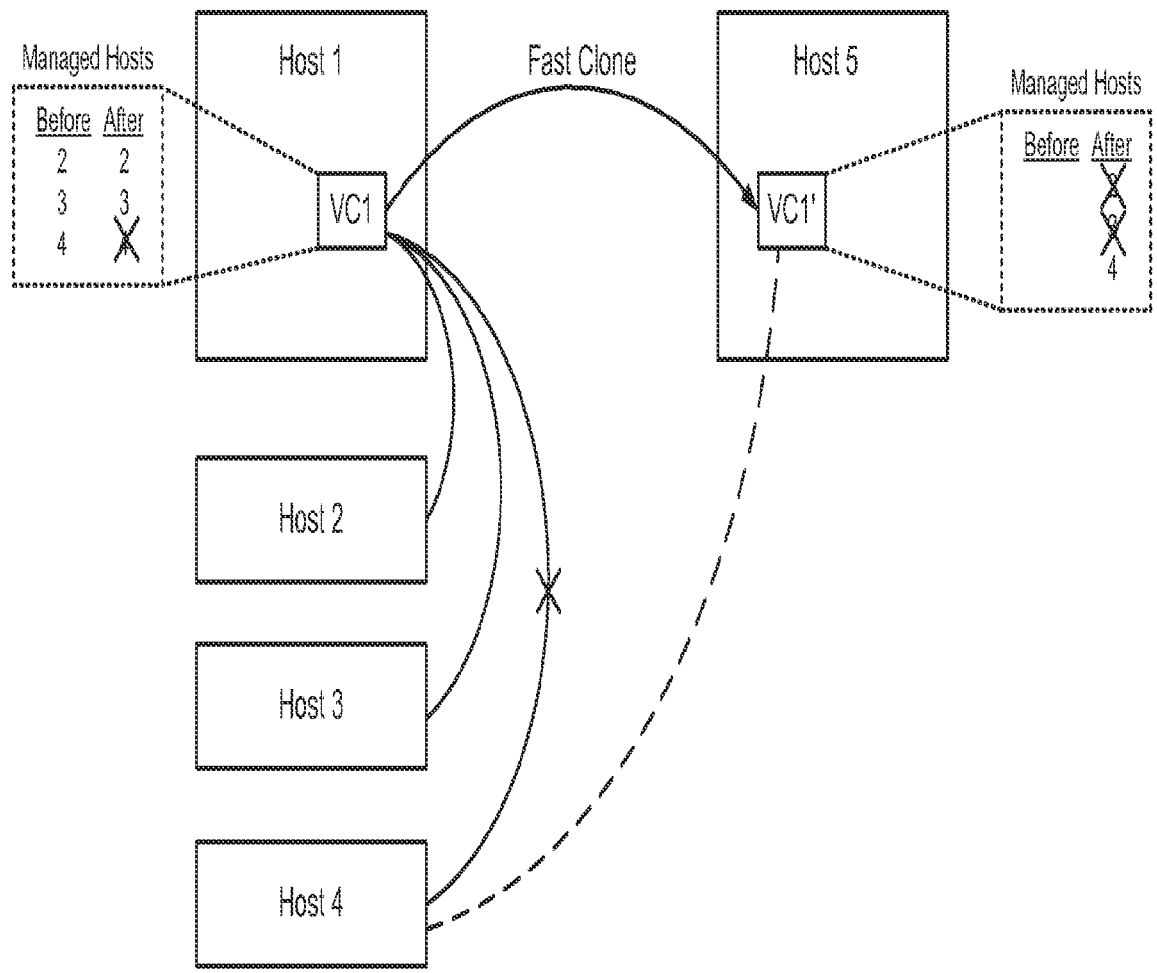
FIG. 9 illustrates an embodiment of a method for creating a VC using cloning.

FIG. 9 illustrates an embodiment of a method for creating a VC using cloning. As previously discussed, VCs can be created in multiple ways, such as creating a VC from a template, creating a blank VC, reactivating a previously suspended VC, etc. In the embodiment shown in FIG. 9, a new VC is created by cloning an original VC. This way, all the management information that the original VC had is immediately available to the cloned VC. Unfortunately, there is initial redundancy in the scope of management. The Master node must coordinate the management scope for each VC, such as identifying which hosts and which VMs are managed by each VC.

After the cloning, the Master node tells each VC which hosts and VMs to delete from their management tables, and which ones to keep. For example, VC1 of FIG. 9 is managing hosts 2, 3, and 4 before the cloning of VC1 to VC1'. The Master node sends instructions to VC1 to delete host 4 from its scope of management and instructions to VC1' to delete hosts 2 and 3. After the VCs complete these operations, the redundancy is eliminated and the VCs continue on to perform their respective management tasks. Similarly, if there are tasks to be performed in VC1's queue (not shown), some tasks will be deleted from VC1 after cloning and the complementary set of waiting tasks in VC1' will be deleted. In one embodiment, VCs are started with all of the hosts in a disconnected state. This way, VC1' does not have to remove hosts and does not try to reconnect the hosts.

Figure 10:
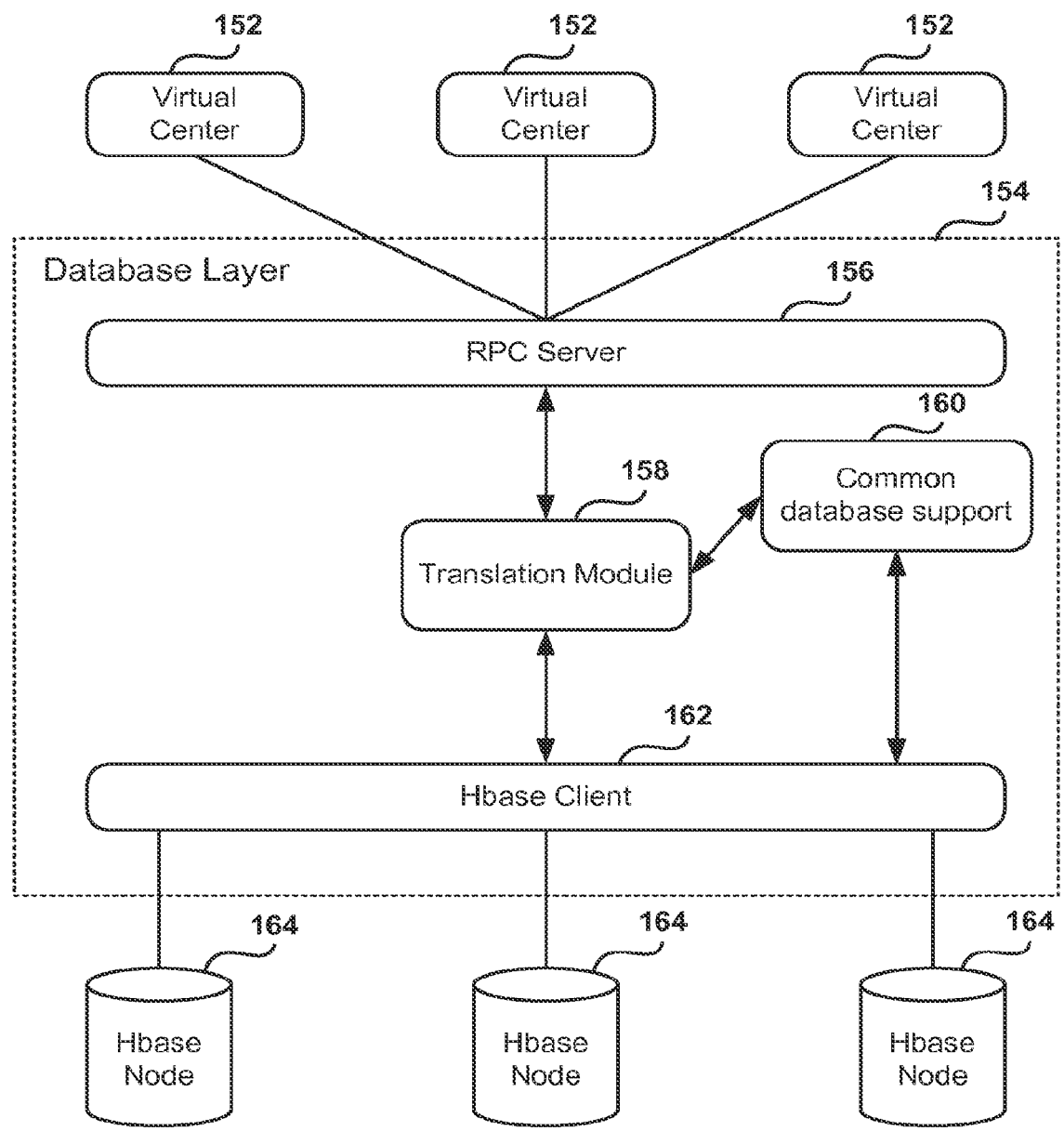
FIG. 10 depicts one embodiment of the global database architecture.

FIG. 10 depicts one embodiment of the global database architecture. In one embodiment of the invention, HBase 164 is used to build the data persistence layer because of HBase's simple scale-out model. HBase is an open-source, column-oriented, distributed database modeled after Google's Bigtable and written in Java. HBase runs on top of HDFS (Hadoop Distributed File System), providing Bigtable-like capabilities for Hadoop. HBase is designed to manage large-scale structured datasets.

Data tables in HBase are both horizontally and vertically partitioned into data blocks named regions. As different regions may observe very different read/write workloads, the distribution of regions among HBase nodes has a significant impact on the overall read/write performance. For instance, some tables of the inventory are accessed much more often than others. If regions of such tables were deployed on a single HBase node, the read/write performance on this table would be limited by the capacity of the single HBase node. To improve performance the tables are partitioned into relatively small regions (i.e. 16 MB each), so that regions of a table can be evenly distributed among multiple HBase nodes 164. In addition, a relatively small flush buffer size (4 MB) is used to reduce the latency of a single flush operation.

Different tables can have heavy skew in the read operation performance. To further improve the performance of read operations on tables that observe frequent reads, some tables are turned into in-memory tables. As in-memory tables, they can be cached in a more aggressive manner and utilize more HBase node memory. In addition, to make HBase truly auto-scale with workload, an HBase performance profiler is used to monitor the performance of HBase. The HBase performance profiler periodically reads the load information from different tables through the HBase client interface. When detecting consistent workload growth, the HBase profiler can dynamically add HBase nodes into the data persistence layer on-the-fly without stopping HBase. Other tools provide key functionality such as backup, restore, and migration of data between HBase and a standard relational database management system (RDBMS).

Database layer DBLayer 154 assists VC nodes 152 to access the data persistence layer by translating RPC calls from VC nodes to data access calls in HBase. The DBLayer makes several contributions to this embodiment of the architecture. First, the DBLayer hides the complexity of HBase access and provides developers an interface that is close to that of a traditional Relational Database Management System (RDBMS), which is important for rapid development and code reuse. For example, the DBLayer provides a query interface and supports join operations between tables. These are not provided by the standard HBase client. Second, the DBLayer makes our architecture platform- and language-independent. Since VC uses RPC calls to access HBase, the VC is not restricted to use a particular HBase client library, which gives more freedom to the deployment of our architecture. Third, the DBLayer provides an additional layer that can preprocess data with knowledge about the management layer. This knowledge can be very useful for migrating existing VC software into our architecture without a significant code re-write on the VC side. For example, we pre-load the inventory with VC nodes that are going to be used for auto-scaling, and then suspend those VMs. Once resumed, the VC nodes do not have to load the inventory again. As a result, it is faster to start up those auto-scaled VC nodes, since they do not have to load the inventory on startup. Each of these VCs with a pre-loaded inventory dynamically connects to its assigned hosts during auto-scaling. The current method of loading the inventory in VC does not distinguish between pre-loading the inventory and loading the inventory while starting up, and as a result, whenever the inventory is loaded, the VC would normally try to connect to each host in the inventory that is marked as "connected." If a host is marked as "disconnected" in the database, however, then VC will not try to connect to it. Rather than change the current VC implementation to differentiate between pre-loading and normal loading, we can implement a special "inventory pre-loading" primitive in the DBLayer and call this primitive when pre-loading the inventory. This pre-loading command will automatically mark a host as "disconnected," so that when the VC node is resumed, it will not connect to that host. Given knowledge of the management layer, the DBLayer can detect when this pre-loading is occurring and correctly call the "inventory pre-loading" primitive instead of the normal inventory loading primitive. Furthermore, it is also possible to partition the inventory among different VC nodes at the DBLayer so that each VC node need only load a subset of the inventory.

The implementation of DBLayer 154 includes a Remote Procedure Call (RPC) server 156, HBase client 162, translation module 158s and common database support 160. RPC server 156 receives RPC calls from VC nodes 152 and uses a thread drawn from a thread pool to handle each RPC call. Each thread calls translation module 158 to determine the appropriate HBase primitives used for the RPC call. The thread then uses HBase client 162 to delegate the HBase access. RPC calls that require operations such as query and join require our modules that support common RDBMS database operations. These are implemented in the Common Database Support Model (CDSM) 160, which provides basic database functionalities such as joins on top of Hbase. Translation module 158 uses CDSM 160 to perform database operations. In one embodiment, the translation module invokes HBase primitives based on RPC calls, where the RPC calls are similar to Structured Query Language (SQL) calls. Because they are similar to SQL calls, they are often easier to use for more developers than standard HBase access methods. RPC server 156 then returns the result to VC nodes 152 after HBase access completes.

A single DBLayer node may have limited resources to support a large set of VC nodes. The capacity of the DBLayer can be extended by simply adding new DBLayer nodes. Since the DBLayer node is stateless, the DBLayer can be easily replicated and started up. VC nodes can be configured to share DBLayer nodes or to use a dedicated DBLayer node at each VC node. Furthermore, because DBLayer nodes are lightweight, they can either run in dedicated VMs, or run inside VC/HBase nodes. Additionally, the shared global database can store information other than information related to hosts and VMs, such as information related to clusters, resource pools, etc.

It should be appreciated that the embodiment illustrated in FIG. 10 is an exemplary embodiment of a database layer using HBase. Other embodiments may utilize different databases, or may arrange modular functionality in varying manners. The embodiment illustrated in FIG. 10 should therefore not be interpreted to be exclusive or limiting, but rather exemplary or illustrative.

Figure 11:
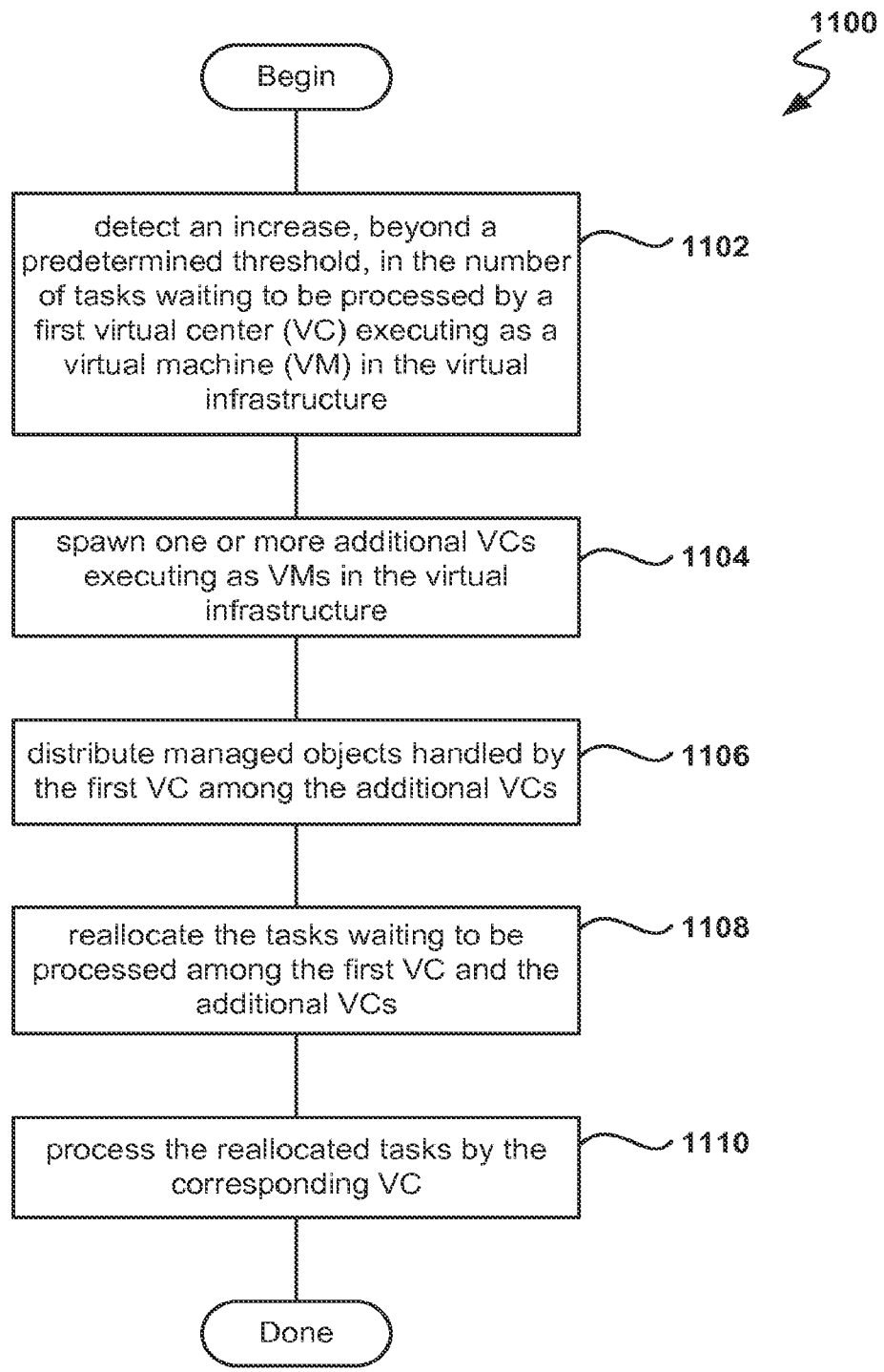
FIG. 11 shows the process flow for performing management tasks in a virtual infrastructure.

FIG. 11 shows the process flow for performing management tasks in a virtual infrastructure. In operation 1102, the method detects an increase, beyond a predetermined threshold, in the number of tasks waiting to be processed by a first virtual center (VC). The first VC executes as a VM in the virtual infrastructure. After operation 1102, the method flows to operation 1104, where the infrastructure spawns one or more additional VCs, which also execute as VMs in the virtual infrastructure. In operation 1106, the managed objects handled by the first VC are distributed among the additional VCs. The tasks waiting to be processed among the first VC and the additional VCs are reallocated in operation 1108. See, for example, FIG. 7 for one embodiment to distribute the queued tasks. In operation 1110, the reallocated tasks are processed by the corresponding VCs.

Figure 12:
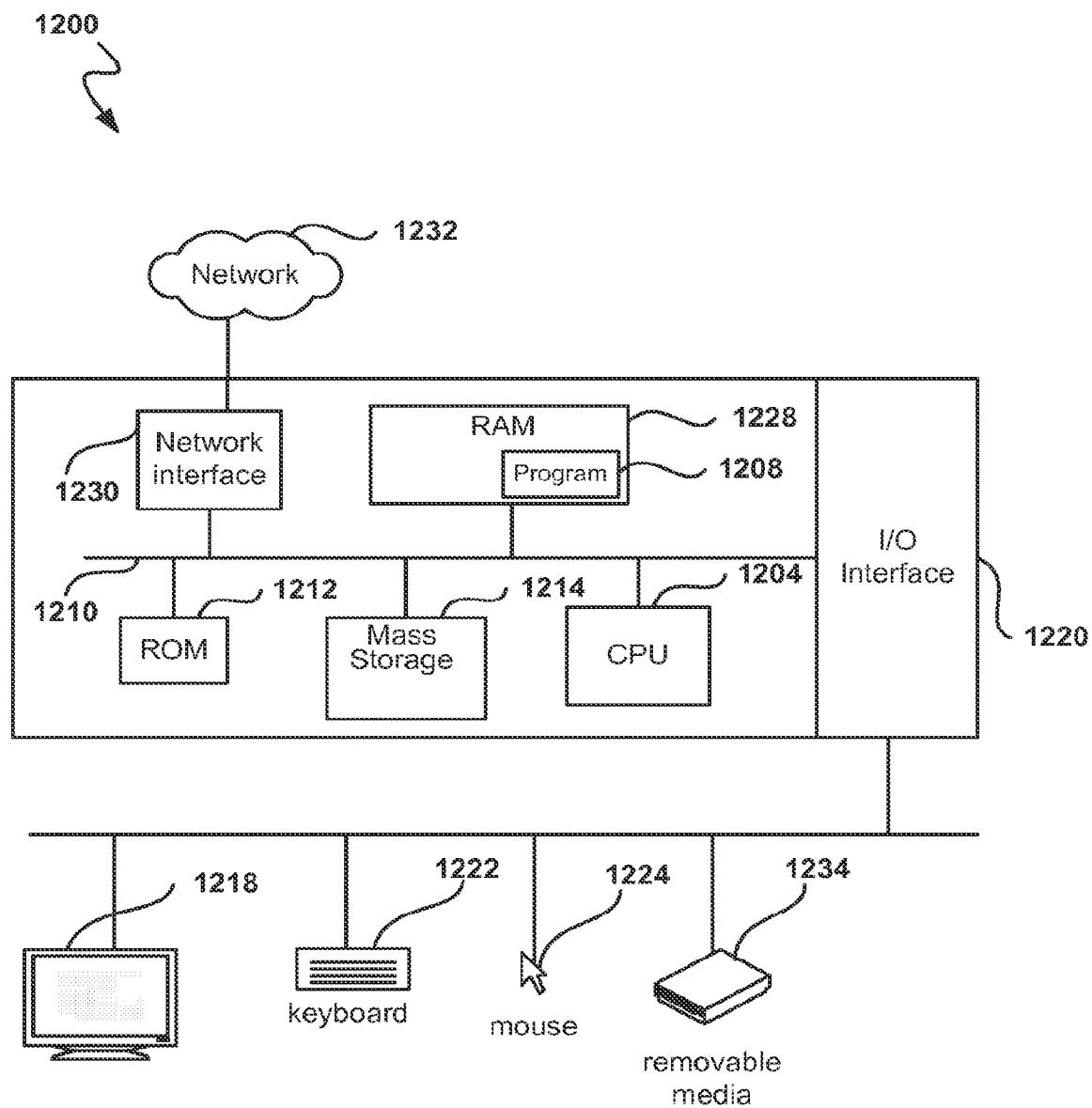
FIG. 12 is a simplified schematic diagram of a computer system for implementing embodiments of the present invention.

FIG. 12 is a simplified schematic diagram of a computer system for implementing embodiments of the present invention. It should be appreciated that embodiments of the invention described herein may be performed with a digital processing system, such as a conventional, general-purpose computer system. Special purpose computers, which are designed or programmed to perform only one function may be used in the alternative. As shown in FIG. 12, the computer system includes a central processing unit 1204, which is coupled through bus 1210 to random access memory (RAM) 1228, read-only memory (ROM) 1212, and mass storage device 1214. Program 1208 resides in RAM 1228, but can also reside in mass storage 1214. Program 1208 can include a virtual machine, a virtual router, and other programs used to implement embodiments of the invention. Mass storage device 1214 represents a persistent data storage device such as a floppy disc drive or a fixed disc drive, which may be local or remote. Network interface 1230 provides connections via network 1232, allowing communications with other devices. It should be appreciated that Central Processing Unit (CPU) 1204 may be embodied in a general-purpose processor, a special purpose processor, or a specially programmed logic device. Input/Output (I/O) interface provides communication with different peripherals and is connected with CPU 1204, RAM 1228, ROM 1212, and mass storage device 1214, through bus 1210. Sample peripherals include display 1218, keyboard 1222, cursor control 1224, removable media device 1234, etc.

Display 1218 is configured to display the user interfaces described herein. Keyboard 1222, cursor control 1224, removable media device 1234, and other peripherals are coupled to I/O interface 1220 in order to communicate information in command selections to CPU 1204. It should be appreciated that data to and from external devices may be communicated through I/O interface 1220.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a network.

With the above embodiments in mind, it should be understood that the invention can employ various computer-implemented operations involving data stored in computer systems. These operations are those requiring physical manipulation of physical quantities. Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. The machines can also be virtualized to provide physical access to storage and processing power to one or more users, servers, or clients. Thus, the virtualized system should be considered a machine that can operate as one or more general purpose machines or be configured as a special purpose machine. Each machine, or virtual representation of a machine, can transform data from one state or thing to another, and can also process data, save data to storage, display the result, or communicate the result to another machine.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in-between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for performing management tasks in a virtual infrastructure that includes a plurality of hosts as managed objects, the method comprising:
   detecting a decrease, below a predetermined threshold, in a number of tasks waiting to be processed by a plurality of virtual centers (VCs) executing as virtual machines (VMs) in the virtual infrastructure, each of the plurality of VCs being a management VM for the managed objects of the virtual infrastructure;
   based on the detected decrease in the number of tasks waiting to be processed, selecting one or more VCs of the plurality of VCs to be removed;
   distributing managed objects handled by the selected one or more VCs to one or more non-selected VCs of the plurality of VCs; and
   removing the selected one or more VCs.

2. The method of claim 1, wherein data regarding hosts and VMs managed by the plurality of VCs is stored in a shared global database.

3. The method of claim 1, wherein detecting a decrease further includes detecting a decrease when a parameter of the plurality of VCs falls below a threshold value, the parameter being one or more of the following: Central Processing Unit (CPU) use, memory use, number of tasks queued, number of hosts managed, and number of nodes managed.

4. The method of claim 1, wherein removing the selected one or more VCs further includes terminating the selected one or more VCs.

5. The method of claim 1, further comprising determining a number of VCs to be removed based on management workload and a processing speed of each of the plurality of VCs.

6. The method of claim 1, wherein distributing managed objects handled by the selected one or more VCs to one or more non-selected VCs of the plurality of VCs further comprises distributing the hosts such that each of the one or more non-selected VCs manages only a subset of the hosts.

7. The method of claim 1, further comprising:
   detecting an increase, above a maximum predetermined threshold, in a number of tasks waiting to be processed by a current plurality of the VCs executing as VMs in the virtual infrastructure; and
   spawning one or more additional VCs executing as VMs in the virtual infrastructure, each of the one or more additional VCs being a management VM for the managed object of the virtual infrastructure.

8. A system for performing management tasks in a virtual infrastructure, the system comprising:
   a plurality of hosts in the virtual infrastructure, the plurality of hosts executing application virtual machines (VMs);

a plurality of virtual centers (VCs) executing as VMs in respective hosts of the plurality of hosts, each of the plurality of VCs being a management VM configured to perform management tasks for operation of a plurality of managed hosts of the plurality of hosts; and a master management node defined to detect a decrease, below a predetermined threshold, in a number of tasks waiting to be processed by the plurality of VCs, wherein upon detecting the decrease, the master management node performs operations of:

selecting one or more VCs of the plurality of VCs to be removed;

reallocating management tasks assigned to the selected one or more VCs to one or more non-selected VCs of the plurality of VCs; and removing the selected one or more VCs.

9. The system of claim 8, wherein detecting a decrease further includes detecting a decrease when a parameter of the plurality of VCs falls below a threshold value, the parameter being one or more of the following: Central Processing Unit (CPU) use, memory use, number of tasks queued, number of hosts managed, and number of nodes managed.

10. The system of claim 8, wherein removing the selected one or more VCs further includes suspending the selected one or more VCs.

11. The system of claim 8, wherein upon detecting the decrease, the master management node further performs operation of determining a number of VCs to be removed based on management workload and a processing speed of each of the plurality of VCs.

12. The system of claim 8, wherein upon detecting an increase, beyond a maximum predetermined threshold, in a number of tasks waiting to be processed by a current plurality of the VCs executing as VMs in the virtual infrastructure, the master management node further performs operations of:

spawning one or more additional VCs executing as VMs in the virtual infrastructure, each of the one or more additional VCs being a management VM configured to perform the management tasks.

13. A computer program embedded in a non-transitory computer-readable storage medium, when executed by one or more processors, for performing management tasks in a virtual infrastructure that includes a plurality of hosts as managed objects, the computer program comprising instructions for:

detecting a decrease, below a predetermined threshold, in a number of tasks waiting to be processed by a plurality of virtual centers (VCs) executing as virtual machines (VMs) in the virtual infrastructure, each of the plurality of VCs being a management VM for the managed objects of the virtual infrastructure;

based on the detected decrease in the number of tasks waiting to be processed, selecting one or more VCs of the plurality of VCs to be removed;

distributing managed objects handled by the selected one or more VCs to one or more non-selected VCs of the plurality of VCs; and removing the selected one or more VCs.

14. The computer program embedded in the non-transitory computer-readable storage medium of claim 13, wherein data regarding hosts and VMs managed by the plurality of VCs is stored in a shared global database.

15. The computer program embedded in the non-transitory computer-readable storage medium of claim 13, wherein detecting a decrease further includes detecting a decrease when a parameter of the plurality of VCs falls below a threshold value, the parameter being selected from a group consisting of Central Processing Unit (CPU) use, memory use, number of tasks queued, number of hosts managed, or number of nodes managed.

16. The computer program embedded in the non-transitory computer-readable storage medium of claim 13, wherein removing the selected one or more VCs further includes terminating the selected one or more VCs.

17. The computer program embedded in the non-transitory computer-readable storage medium of claim 13, wherein the computer program further comprises instructions for determining a number of VCs to be removed based on management workload and a processing speed of each of the plurality of VCs.

18. The computer program embedded in the non-transitory computer-readable storage medium of claim 13, wherein distributing managed objects handled by the selected one or more VCs to one or more non-selected VCs of the plurality of VCs further comprises distributing the hosts such that the one or more non-selected VCs manages only a subset of the hosts.

19. The computer program embedded in the non-transitory computer-readable storage medium of claim 13, wherein removing the selected one or more VCs comprises suspending the selecting one or more VCs such that the suspended one or more VCs can be made available when an increase in a number of tasks waiting to be process by the non-selected VCs exceeds a maximum predetermined threshold.

20. The computer program embedded in the non-transitory computer-readable storage medium of claim 19, wherein the computer program further comprises instructions for:

detecting an increase, above a maximum predetermined threshold, in a number of tasks waiting to be processed by the non-selected VCs executing as VMs in the virtual infrastructure;

un-suspending the one or more selected VCs; and distributing the managed objects handled by the non-selected VCs among the one or more un-suspended VCs.

* * * * *